United States Patent [19]

Moustakas et al.

[11] Patent Number: 4,528,082

[45] Date of Patent: Jul. 9, 1985

[54] METHOD FOR SPUTTERING A PIN AMORPHOUS SILICON SEMI-CONDUCTOR DEVICE HAVING PARTIALLY CRYSTALLIZED P AND N-LAYERS

[75] Inventors: Theodore D. Moustakas; H. Paul Maruska, both of Annandale, N.J.

[73] Assignee: Exxon Research and Engineering Co., Florham Park, N.J.

[21] Appl. No.: 535,901

[22] Filed: Sep. 26, 1983

[51] Int. Cl.[3] .................. C23C 15/00; H01L 31/18
[52] U.S. Cl. .................. 204/192 S; 136/258; 136/255; 357/2; 357/30
[58] Field of Search .......... 204/192 S, 192 P; 357/2, 30; 136/258 AM, 255

[56] References Cited

U.S. PATENT DOCUMENTS 4,270,018  5/1981  Gibbons .............. 136/258 AM
4,417,092  11/1983  Moustakas et al. ...... 136/258 AM

FOREIGN PATENT DOCUMENTS 57-187971  11/1982  Japan .............. 136/258 AM
57-204178  12/1982  Japan .............. 136/258 AM

OTHER PUBLICATIONS

E. Sabisky et al., "Amorphous Silicon Materials & Solar Cells: Progress & Directions", *Conf. Record, 16th IEEE Photovoltaic Specialists Conf.*, (published 1983), pp. 1106-1110.
S. R. Das et al., *J. Appl. Phys.*, vol. 54, pp. 3101-3105 (1983).

Primary Examiner—Aaron Weisstuch
Attorney, Agent, or Firm—Ronald D. Hantman

[57] ABSTRACT

A high efficiency amorphous silicon PIN semiconductor device having partially crystallized (microcrystalline) P and N layers is constructed by the sequential sputtering of N, I and P layers and at least one semi-transparent ohmic electrode. The method of construction produces a PIN device, exhibiting enhanced electrical and optical properties, improved physical integrity, and facilitates the preparation in a singular vacuum system and vacuum pump down procedure.

26 Claims, 3 Drawing Figures

METHOD FOR SPUTTERING A PIN AMORPHOUS SILICON SEMI-CONDUCTOR DEVICE HAVING PARTIALLY CRYSTALLIZED P AND N-LAYERS

BACKGROUND OF THE INVENTION

The present invention results from research performed under U.S. Government Contract No. XZ-0-9219 for the Solar Energy Research Institute.

FIELD OF THE INVENTION

The present invention relates to hydrogenated amorphous silicon and more particularly to a method for reactively sputtering a PIN amorphous silicon semiconductor device having partially crystallized P and N layers.

Amorphous silicon has been used in a number of semiconductor devices, the most promising of which is the PIN structure. Such devices were first fabricated by the method of glow discharge decomposition of silane and described in a technical publication by D. E. Carlson, J. Non-Crystalline Solids, 35–36, (1980) p. 707. The P and N layers in this method are deposited by mixing approximately 1 to 2% of $B_2H_6$ or $PH_3$ in the silane discharge. The principal deficiency of this device, as noted by Carlson, is that the P-layer which forms the major semiconductor junction with the I-layer, is both poorly conductive and absorbs the incident light energy without significantly contributing to the collection of photogenerated charge carriers in the device. Because the N-layer absorbs much less light than the P-layer, Carlson has shown that illumination from the N-side leads to higher solar cell efficiency.

A further improvement to the efficiency of this device has been described in a technical publication by Y. Uchida et al., *Japanese Journal of Applied Physics*, 21, (1982) p. L586. These authors fabricated the N-layer by glow discharge decomposition of a mixture of $SiH_4$-$H_2$-$PH_3$ and high power in the discharge. Under these conditions, they claim that the N-layer is partially crystallized (microcrystalline) and therefore it is both highly conductive and highly transparent in the visible part of the spectrum. This type of N-layer is ideal as a "window" material and leads to a 13% improvement in the short-circuit current of the solar cell. The devices reported by Uchida have the configuration stainless steel/PIN/ITO with the P and I-layers being amorphous and the N-layer being microcrystalline.

PIN semiconductor devices have also been fabricated by the method of reactive sputtering and described in a technical publication by T. D. Moustakas and R. Friedman, *Appl. Phys. Lett.* 40, (1982) p. 515. The I-layer of these devices was fabricated by sputtering from an undoped silicon target in an atmosphere of Argon containing 10–20% $H_2$. The P and N-layers were fabricated by adding approximately 0.1 to 1% of $B_2H_6$ or $PH_3$ in the Ar-$H_2$ discharge. The hydrogen content for the "window" (P-layer) was increased to approximately 20 to 40% in order to improve its transparency to visible light. All three layers (P, I, N) of this device are amorphous.

In view of the improvements of the solar cell efficiency of PIN devices produced by glow discharge decomposition of silane employing a microcrystalline N-contact as a "window" layer, it is important to fabricate such devices by the method of RF sputtering.

SUMMARY OF THE INVENTION

The invention is directed to a method for depositing by RF sputtering an amorphous PIN Semiconductor device, having the "window" (P or N) or both contacts deposited under conditions which lead to partially crystallized (microcrystalline) material. The method of the present invention shall be illustrated and described with respect to a PIN device. It is to be understood, however, that the method of the present invention applies equally well to an NIP device.

A microcrystalline N-layer is deposited by RF sputtering from an undoped silicon target in an atmosphere containing hydrogen, argon and phosphine at a total pressure larger than 20 mTorr with $H_2/Ar >> 1$ and phosphine content approximately 0.1 to 1% of the argon content. The power in the discharge is adjusted to lead to DC bias target voltage of between $-800$ to $-2000$ volts and the substrate temperature to between 200° to 400° C. An intrinsic layer is also reactively sputtered from an undoped target in an atmosphere of 5 to 15 mTorr of argon containing 10 to 20% hydrogen. The target voltage and the substrate temperature are the same as during the deposition of the N-layer. This I-layer is amorphous. A microcrystalline P-layer is reactively sputtered from an undoped silicon target in an atmosphere containing hydrogen, argon and diborane at a total pressure larger than 20 mTorr with $H_2/Ar >> 1$ and diborane content approximately 0.1 to 1% of the argon content. The target voltage and the substrate temperature vary in the same range as those of the N and I-layers. The contact (P or N) which is deposited on the top of the I-layer is preferably deposited at lower target voltage ($\sim -800$ volts) in order to avoid surface damage of the I-layer. [The three layers are deposited sequentially in three interlocked chambers in order to avoid cross contamination between the layers. If they are deposited in the same chamber the chamber has to be purged and sputter-cleaned between the first doped and the intrinsic layer.] Transparent electrodes and metallic grids are also sputter deposited which permits the entire deposition to be accomplished in one sputtering apparatus and in one vacuum pump-down. When the P and N layers are fabricated in microcystalline form, the PIN solar cells have an open circuit voltage of about 0.1 to 0.20 V higher then entirely amorphous PIN solar cells and 10 to 20% higher short circuit current due to the better blue response of these solar cells.

DETAILED DESCRIPTION OF THE INVENTION

Figure 1:
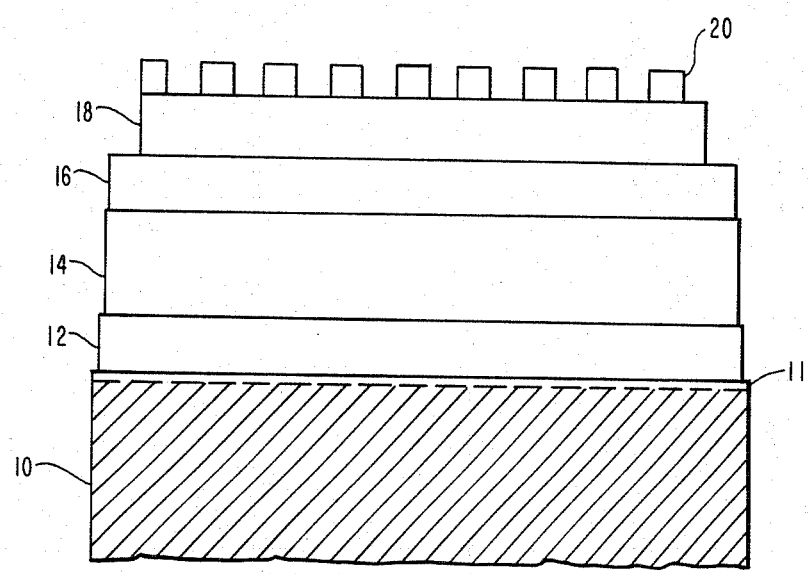
FIG. 1 shows a greatly enlarged side view of a semiconductor device constructed in accordance with the teaching of the present invention.

The sputtered amorphous silicon PIN device of the present invention, as illustrated in FIG. 1, includes a substrate 10 which generally comprises a physically supportive substrate for the overlying sputter deposited layers. Substrate 10 includes a major area coating surface which is substantially free from voids or protrusions of the order (in size) of the thickness of the overlying layers to avoid pin holes therethrough.

In one embodiment, substrate 10 may comprise a non-electroconductive material such as glass or ceramic for which an overlying layer of an electroconductive material 11 is required. Alternately, substrate 10 may comprise a metal concurrently serving as a supportive substrate and an electrode contact to the overlying layers. In either instance, the coating surface of the substrate is thoroughly cleaned to remove unwanted contamination of the coating surface. In a preferred embodiment, electrode 10 comprises a metal known to form an ohmic contact to N-doped silicon such as molybdenum or stainless steel for example. In the case where substate 10 comprises a nonelectroconductive material it is preferred that layer 11 comprise a layer of metal known to form an ohmic contact to N-doped microcrystalline silicon; examples are molybdenum or chromium thin films of approximately 1,000 to 2,000 Å thick or a transparent conductive oxide such as ITO, $SnO_2$, or cadmium stannate approximately 1000 Å thick.

The substrates are fastened to the anode electrode of a conventional RF diode sputtering unit which is adapted to provide controlled partial pressures of hydrogen, argon, phosphine, and diborane as detailed hereinafter. The term secured is intended in this application to mean both the physical securing of the substrate to the anode electrode and more importantly the electrical contacting of the conducting coating surface to the anode electrode. In this manner, the coating surface is maintained at the approximate electrical potential of the anode electrode. The anode electrode is either electrically grounded or supplied with a positive or negative bias of approximately +50 volts. The sputtering system is further adapted to provide for controlled temperature heating of the substrates. The deposition temperature as recited hereinafter is measured by a thermocouple embedded in the anode electrode.

It is to be recognized that the temperatures recited hereinafter are measured accordingly and the actual temperature of the depositing film may differ.

The sputtering system is evacuated to a base pressure of about $1\times10^{-7}$ Torr by conventional mechanical and turbomolecular pumping means. An N-layer of hydrogenated microcrystalline silicon, 12, is sputter deposited by first heating substrate to a monitored temperature ranging from about 200° C. to about 400° C. A sputtering target comprising a poly-crystalline undoped silicon disc about 5" in diameter is secured to the cathode electrode being located about 4.5 cm from the substrate platform (anode electrode). Consistent with the condition $H_2/Ar>>1$ and total pressure $\geq 20$ mTorr, as described above, the sputtering atmosphere comprises a partial pressure of hydrogen ranging from about 20 mTorr to about 80 mTorr and argon ranging from about 3 mTorr to about 10 mTorr. For the best microcrystalline material, a preferred combination of parameters should be $H_2/Ar\geq 10$ and $H_2+Ar\geq 40$ mTorr. To dope the hydrogenated microcrystalline silicon layer N an amount of phosphine ($PH_3$) is added to the partial pressures of hydrogen and argon. In one embodiment, the argon source contains 0.2-1 atomic % of phosphine. The sputtering is accomplished at an RF power of about 100 to 200 watts resulting in an induced DC bias of about $-800$ to $-2000$ volts relative to the electrically grounded substrate platform (anode). The deposition rate of the films depends on the relative amounts of $H_2$ to Ar in the discharge. These conditions lead to deposition rates between 10 to 40 Å/sec. These lower deposition rates of the microcrystalline material as compared to amorphous material are caused by the higher concentration of $H_2$ which leads to the etching of the deposited film and thus competes with the deposition process of silicon. The sputter deposition continues for a time ranging from a minimum of 2.5 min. to about 10 mins., resulting in a thickness of the N-layer, 12, ranging from about 100 angstroms to about 400 angstroms. Alternatively, the N layer can be produced in a graded form extending up to 500 to 1000 Å. This can be accomplished by progressively reducing the amount of $PH_3$ in the discharge. The substrate heating described heretofore continues throughout the deposition to maintain the monitored substrate temperature within the indicated range. This results in a proper level of hydrogenation of the depositing microcrystalline silicon, which was found to be about 3-4% by unfrared spectroscopy.

An intrinsic layer of hydrogenated silicon 14 is sputter deposited from an undoped silicon target in an atmosphere containing pure argon and hydrogen. This layer 14 is amorphous. The sputtering atmosphere for depositing the intrinsic layer ranges from about 3 mTorr to about 15 mTorr of pure argon and from about 0.3 mTorr to about 1.5 mTorr of hydrogen. The RF power conditions, cathode and anode configuration, and substrate temperature are substantially identical to that described for the sputter deposition of the N-layer. Under these conditions, a layer of intrinsic amorphous silicon ranging from about 0.2 microns to about 1.5 microns in thickness is deposited at a rate ranging from 60 Å/min to 1000 Å/min.

A P-doped layer of hydrogenated microcrystalline silicon 16 is sputtered deposited from an atmosphere of argon, hydrogen and diborane. Consistent with the condition $H_2/Ar>>1$ and total pressure $>20$ mTorr, as described above, a sputtering atmosphere comprising argon and hydrogen having partial pressures ranging from about 3 mTorr to about 10 mTorr and about 20 mTorr to about 80 mTorr respectively, includes a level of diborane dopant sufficient to dope the microcrystalline silicon P-type. For the best microcrystalline material, a preferred combination of parameters should be $H_2/Ar\geq 10$ and $H_2+Ar\geq 40$ mTorr. In one embodiment, the argon source contains about 0.2 to 1 atomic % of diborane ($B_2H_6$). The sputtering power conditions, monitored substrate temperature ranges, and configuration of the anode and cathode electrodes are substantially identical to those described for the deposition of the N and I layers. The deposition rate of the film depends on the relative amounts of H and Ar in the discharge. These conditions lead to deposition rates of 10 Å/min to 40 Å/min. The thickness of the P-layer, as compared to the thickness of the intrinsic and N-doped layers is smaller, ranging from about 80 to about 150 angstroms. As presently understood, the P-layer functions to form a potential barrier with the I-layer. The P and N layers fabricated according to the descriptions given above were found by X-ray and Raman spectroscopy to be partially crystallized with crystallite size of 50-60 Å. Furthermore, the index of refraction of these P and N layers in the visible spectral region are about 3.0 while that of the amorphous silicon is about 4.0. The P and N layers were also found to be about one half an order of magnitude less absorbing to visible light than the corresponding amorphous layers. In addition, they have conductivities between 1 and 10 $(\Omega cm)^{-1}$ while the corresponding amorphous P and N layers have conductivities of $10^{-2}$ to $10^{-3}$ $(\Omega cm)^{-1}$. A current collection electrode 18, comprises an electroconductive material which is semi-transparent in the spectral region ranging from about 3,500 angstroms to about 7,000 angstroms, which constitutes the principal absorption region of the underlying amorphous silicon film layers. Further, electrode 18 must form a substantially ohmic contact to the contiguous P-doped microcrystalline silicon. In one embodiment, electrode 18 may comprise a semi-transparent conductive oxide such as indium tin oxide, tin oxide, or cadmium stannate. In such an embodiment, the thickness of the conductive oxide may be tailored to provide an anti-reflection coating to the underlying amorphous silicon surface. These conductive oxides are deposited by RF sputtering from corresponding targets. It is desirable that the oxide be deposited on the solar cell at temperatures between 250° and 300° C. to anneal any induced sputtering damage on the solar cell and to improve the sheet resistance which was found to be about $50\Omega/\square$. The index of refraction of these oxides is about 2 to 2.2. Therefore, the index of refraction of the P and N layers of about 3 is an intermediate value between that of the oxide and that of the I layers. This gradual transition of the indices of refraction is desirable for better collection of light. In an alternative embodiment, electrode 18 may comprise a relatively thin metallic layer, also being semitransparent and forming an ohmic contact to P-doped microcrystalline silicon. An example is platinum.

To further assist in the collection of current generated by the photovoltaic device, a grid electrode 20 may be patterned on the surface of electrode 18. The electroconductive grid, generally configured to minimize the area of coverage and concurrently minimize the series resistance of the photovoltaic cell, may be constructed by several alternate techniques well known in the art.

Those skilled in the art recognize that the use of a glass or other similarly transparent substrate 10, having an transparent electroconductive layer 11 (e.g. ITO or $SnO_2$), permits illumination of the device through the substrate. Furthermore, the deposition sequence of P and N layers may be reversed to deposit a layer of P microcrystalline silicon onto an ITO coated substrate, having the intrinsic and N layers deposited thereupon.

It is to be recognized that the several layers comprising the photovoltaic device described heretofore, may be accomplished by sputtering techniques facilitating the construction of this device in a singular vacuum sputtering unit and in a singular vacuum pump down. It should further be recognized that the sputtering techniques used in the construction of a photovoltaic device of the present invention result in enhanced physical integrity and adherance of the deposited films. The method manifests in an ability to sputter deposit a layer of semi-transparent conductive oxides such as indium tin oxide onto a relatively thin P doped layer, 16, without deteriorating the junction forming characteristics of the underlying silicon layers. Essentially, the cell can be illuminated either from the substrate side or the side opposite the substrate because of the superior properties of the sputtered microcrystalline N and P layers.

EXAMPLE

Figure 2:
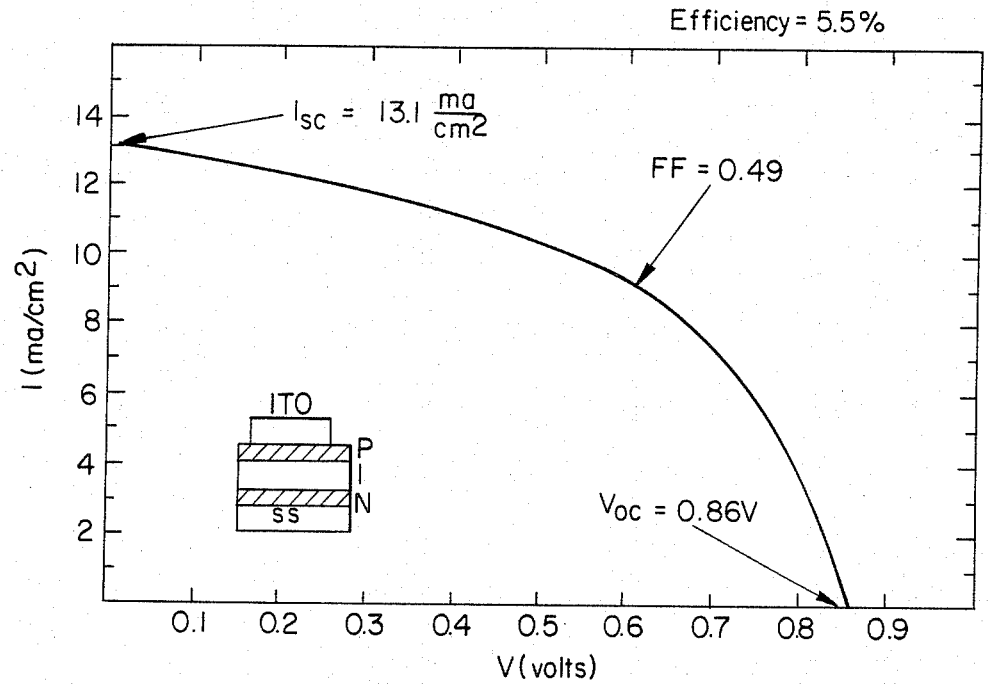
FIG. 2 shows the I-V characteristics of a sputtered PIN solar cell having microcrystalline P and N layers.

FIG. 2 shows the I-V characteristics of a sputtered amorphous silicon PIN solar cell structure employing microcrystalline P and N layers. Note that the short circuit current in this device is 13 $mA/cm^2$ and the open circuit voltage is 0.86 volts. If these numbers are combined with the fill factor of 0.49 (see FIG. 2), the efficiency is between 5% and 6%. The substrate in this structure is mirror polished stainless steel. This substrate was ultrasonically cleaned and degreased before it was fastened to the anode electrode of the previously described diode sputtering unit. The vacuum chamber was evacuated to a base pressure of $1 \times 10^{-7}$ Torr and the substrate was heated to 325° C. The three active layers of the device were deposited under the conditions and order described below:

The partially crystallized N-layer was deposited in an atmosphere of 40 mTorr of $H_2 + Ar + PH_3$. The partial pressures of these gases were 36 mTorr of hydrogen and 4 mTorr of argon. The phosphine was contained in the cylinder of argon at a concentration of 0.2 atomic %. Therefore, during the deposition of this layer the ratio of $H_2/Ar$ was much larger than one and the total pressure was larger than 20 mTorr. Both of these conditions were found to be necessary for the deposition of partially crystallized N-layer. The polycrystalline undoped silicon target, 5" in diameter, was supplied with an RF power of 100 watts leading to a target voltage of $-1200$ volts. The deposition lasted for 6 min., leading to a film of approximately 200 Å thick. As mentioned earlier, this film has a conductivity of about 10 $(\Omega cm)^{-1}$ and is far more transparent than the corresponding amorphous N-layer.

At this point the substrate with the N-layer was transferred to another clean chamber for the deposition of the intrinsic I-layer. This layer was deposited in an atmosphere of 5 mTorr of $Ar + H_2$. The hydrogen content in this discharge was approximately 18% of the argon content. The 5" polycrystalline undoped silicon targe was supplied with an RF power of 80 watts, leading to a bias voltage of $-1000$ volts. The deposition for this layer lasted 60 min., leading to an I-layer about 4000 Å thick. The substrate temperature during this deposition was maintained at 325° C.

The partially crystallized P-layer was deposited next in an atmosphere of 40 mTorr of $H_2 + Ar + B_2H_6$. The partial pressures of these gases were 36 mTorr of hydrogen and 4 mTorr of argon. The $B_2H_6$ was contained in the cylinder of argon at a concentration of 0.2 atomic %. Under these conditions, the P-layer is partially crystallized, having a conductivity of about 2 $(\Omega cm)^{-1}$ and high transparency. The polycrystalline undoped silicon target, 5" in diameter, was supplied with an RF power of 60 watts, leading to a target voltage of $-800$ volts. The deposition of this layer lasted for 3 min., leading to a P-layer of 100 Å thickness.

At this point the substrate with the three active layers (N,I,P) was moved to another sputtering chamber for the deposition of an ITO (Indium Tin Oxide) layer on the top of the P-layer. This layer was deposited from an ITO target in an atmosphere of argon. The target voltage during this deposition was maintained at $-600$ volts and the thickness of this layer was chosen to be 600 to 700 Å. A metal grid made of silver was deposited on the top of the ITO.

Figure 3:
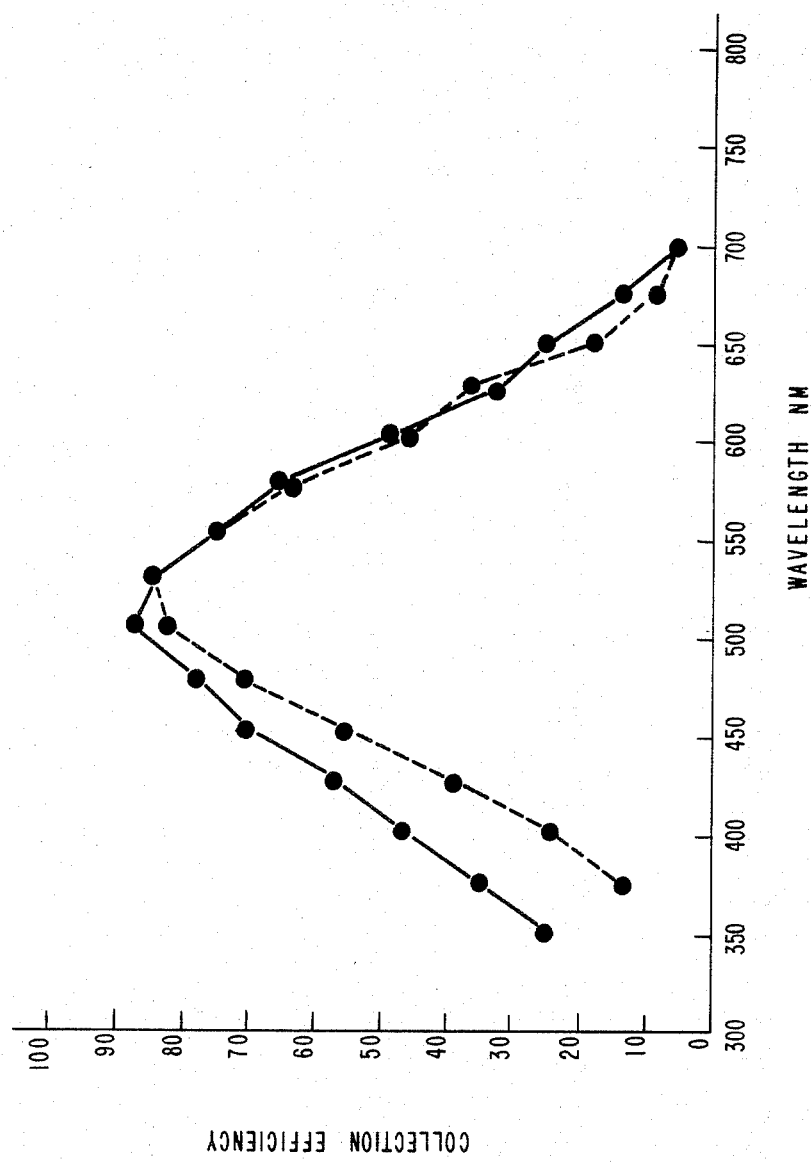
FIG. 3 shows the increase (curve ———) in the collection efficiency in the blue portion of the spectrum of a PIN Cell by using a microcrystalline P-layer for the front contact and a microcrystalline N-layer as the rear contact compared to one (curve ———) having amorphous P and N-layers.

FIG. 3 shows the increase (curve - - - ) in the collection efficiency in the blue portion of the spectrum of a PIN Cell by using a microcrystalline P-layer for the front contact and a microcrystalline N-layer as the rear contact compared to one (curve - - - ) having amorphous P- and N-layers.

What is claimed is:

1. A method for producing an amorphous silicon PIN semi-conductor device having partially crystallized microcrystalline P and N-layers comprising:

providing a substrate having at least a surface region comprising an electroconductive material which forms an ohmic contact to doped microcrystalline silicon;

reactively RF diode sputtering a layer of microcrystalline silicon doped with one type of charge carrier in partial pressures of hydrogen, ranging from about 20 mTorr to about 80 mTorr, and argon ranging from about 3 mTorr to about 10 mTorr onto at least said surface region of the substrate;

reactively RF diode sputtering a layer of amorphous intrinsic, I, silicon onto said layer of silicon doped with said one type of charge carrier;

reactively RF diode sputtering a layer of microcrystalline silicon doped with the opposite type of charge carrier in partial pressures of hydrogen, ranging from about 20 mTorr to about 80 mTorr, and argon ranging from about 3 mTorr to about 10 mTorr onto said I layer;

sputtering an electroconductive material onto at least a region of said layer of microcrystalline silicon doped with said opposite type of charge carrier which material forms an ohmic contact thereto.

2. The method of claim 1 wherein said one type of charge carrier is N type and said opposite type of charge carrier is P type.

3. The method of claim 2 wherein said reactive sputtering of N doped microcrystalline silicon comprises sputtering microcrystalline silicon in partial pressures of hydrogen, ranging from about 20 mTorr to about 80 mTorr, and argon ranging from about 3 mTorr to about 10 mTorr, said argon including about 0.2 to 1 atomic % of phosphine ($PH_3$).

4. The method of claim 3 wherein said N-doped microcrystalline silicon is sputtered from an undoped polycrystalline silicon target.

5. The method of claim 4 wherein said target is about five inches in diameter and located a distance of about 4.5 cm from said substrate.

6. The method of claim 5 wherein an RF sputtering power of about 100 watts to 200 watts is coupled to the plasma, resulting in a target dc voltage of about $-800$ volts to about $-2000$ volts.

7. The method of claim 6 wherein said substrate is maintained at a temperature ranging from about 200° C. to about 400° C.

8. The method of claim 2 wherein said N layer ranges in thickness from about 100 up to about 1,000 Angstroms.

9. The method of claim 2 wherein said N layer comprises a doping level gradient of phosphorus through the thickness of the N layer.

10. The method of claim 2 wherein said reactive sputtering of the P layer of microcrystalline silicon comprises sputtering microcrystalline silicon in partial pressures of hydrogen, ranging from about 20 mTorr to about 80 mTorr, and argon, ranging from about 3 mTorr to about 10 mTorr, said argon containing about 0.2 to 1 atomic % of diborane, $B_2H_6$.

11. The method of claim 10 wherein said P layer ranges in thickness from about 80 Å to about 150 Angstroms.

12. The method of claim 11 wherein said P layer is about 100 Å in thickness.

13. The method of claim 2 wherein said electroconductive material, sputtered onto said P-doped microcrystalline silicon is a thin film of material selected from the group consisting of indium tin oxide, tin oxide, and cadmium stannate.

14. The method of claim 13 wherein said electroconductive material is a thin film of indium tin oxide.

15. The method of claim 1 wherein said one type of charge carrier is P type and said opposite type of charge carrier is N type.

16. The method of claim 15 wherein said reactive sputtering of N doped microcrystalline silicon comprises sputtering microcrystalline silicon in partial pressures of hydrogen, ranging from about 20 mTorr to about 80 mTorr, and argon ranging from about 3 mTorr to about 10 mTorr, said argon including about 0.2 to 1 atomic % of phosphine ($PH_3$).

17. The method of claim 16 wherein said N-doped microcrystalline silicon is sputtered from an undoped polycrystalline silicon target.

18. The method of claim 17 wherein an RF sputtering power of about 100 watts to 200 watts is coupled to the plasma, resulting in a target dc voltage of about $-800$ volts to about $-2000$ volts.

19. The method of claim 15 wherein said N layer comprises a doping level gradient of phosphorus through the thickness of the N layer.

20. The method of claim 15 wherein said reactive sputtering of the P layer of microcrystalline silicon comprises sputtering microcrystalline silicon in partial pressures of hydrogen, ranging from about 20 mTorr to about 80 mTorr, and argon, ranging from about 3 mTorr to about 10 mTorr, said argon containing about 0.2 to 1 atomic % of diborane, $B_2H_6$.

21. The method of claim 1 wherein said substrate is selected from the group consisting of Mo, stainless steel, and Cr.

22. The method of claim 1 wherein said substrate comprises glass having an electroconductive coating of indium tin oxide, Tin oxide, or cadmium stanate.

23. The method of claim 1 wherein said reactive sputtering of the intrinsic, I, layer of silicon comprises sputtering silicon in partial pressures of hydrogen, ranging from about 0.3 mTorr to about 1.5 mTorr, and argon, ranging from about 3 mTorr to about 15 mTorr.

24. The method of claim 23 wherein said intrinsic layer ranges in thickness from about 0.2 $\mu$m to about 1.5 $\mu$m.

25. The method of claim 24 wherein an RF sputtering power of about 100 watts to 200 watts is used to sputter said intrinsic silicon layer from an undoped target which is about five inches in diameter and located a distance of about 4.5 cm from said substrates.

26. The method of claim 23 wherein said substrates are maintained at a temperature ranging from about 200° C. to about 400° C. during said sputtering.

* * * * *